(12) United States Patent
Yeh (10) Patent No.: US 12,051,603 B2
(45) Date of Patent: Jul. 30, 2024

(54) SYSTEM AND METHOD FOR ANNEALING DIE AND WAFER

(71) Applicant: SYSTEM FOR ANNEALING DIE AND WAFER, Hsinchu (TW)

(72) Inventor: Hsin-Hao Yeh, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 305 days.

(21) Appl. No.: 17/313,276

(22) Filed: May 6, 2021

(65) Prior Publication Data

US 2021/0257230 A1 Aug. 19, 2021

Related U.S. Application Data

(62) Division of application No. 15/906,166, filed on Feb. 27, 2018, now Pat. No. 11,011,394.

(Continued)

(51) Int. Cl.
*H01L 21/67* (2006.01)
*H01L 21/225* (2006.01)
(Continued)

(52) U.S. Cl.
CPC .... *H01L 21/67115* (2013.01); *H01L 21/2253* (2013.01); *H01L 21/268* (2013.01); *H01L 21/324* (2013.01); *H01L 21/67248* (2013.01); *H01L 21/67259* (2013.01); *H01L 21/67294* (2013.01); *H01L 21/68* (2013.01); *H01L 22/26* (2013.01); *H01L 23/544* (2013.01); *H01L 22/10* (2013.01); *H01L 22/12* (2013.01); *H01L 2223/54426* (2013.01); *H01L 2223/54453* (2013.01); *H01L 2223/54493* (2013.01)

(58) Field of Classification Search
CPC . H01L 21/2253; H01L 21/268; H01L 21/324; H01L 21/67115; H01L 21/67248; H01L 21/67259; H01L 21/67294; H01L 21/68; H01L 22/10; H01L 22/12; H01L 22/26; H01L 2223/54426; H01L 2223/54453; H01L 2223/54493; H01L 23/544; H01L 29/66795
USPC ............................ 392/416; 219/121.6–121.83
See application file for complete search history.

(56) References Cited

U.S. PATENT DOCUMENTS 6,638,800 B1 * 10/2003 Ishihara ................. B23K 26/04
                                                                438/795
6,675,057 B2 * 1/2004 Liu ........................ H01L 21/268
                                                                219/121.85

(Continued)

*Primary Examiner* — Sang Y Paik
(74) *Attorney, Agent, or Firm* — McClure, Qualey & Rodack, LLP (57) ABSTRACT

Systems for annealing a wafer are provided. A system includes a wafer stage, a laser beam generator, and a controller. The laser beam generator is configured to generate a laser beam. The controller is configured to control the laser beam generator according to information regarding layout of a first semiconductor die of the wafer, so as to project the laser beam with a first laser parameter onto the first semiconductor die of the wafer on the wafer stage along at least one annealing orbit. The controller is configured to arrange the annealing orbit to partially cover the first semiconductor die of the wafer and to uncover a plurality of second semiconductor dies of the wafer.

20 Claims, 7 Drawing Sheets

Related U.S. Application Data

(60) Provisional application No. 62/589,002, filed on Nov. 21, 2017.

(51) Int. Cl.
    *H01L 21/268*     (2006.01)
    *H01L 21/324*     (2006.01)
    *H01L 21/66*     (2006.01)
    *H01L 21/68*     (2006.01)
    *H01L 23/544*     (2006.01)

(56) References Cited

U.S. PATENT DOCUMENTS

| | | |
|---|---|---|
| 2005/0122515 A1* | 6/2005 | Borden .................. G01N 21/55 356/369 |
| 2007/0218644 A1 | 9/2007 | Balakrishna et al. |
| 2008/0099454 A1* | 5/2008 | Kida .................... B23K 26/032 219/121.68 |
| 2008/0210667 A1 | 9/2008 | Yang et al. |
| 2009/0045182 A1 | 2/2009 | Lerner et al. |
| 2009/0120924 A1 | 5/2009 | Moffatt et al. |
| 2010/0068898 A1 | 3/2010 | Moffatt et al. |
| 2010/0075490 A1 | 3/2010 | Li |
| 2010/0187444 A1 | 7/2010 | Yang et al. |
| 2010/0216261 A1 | 8/2010 | Brenninger et al. |
| 2013/0052837 A1 | 2/2013 | Wang et al. |
| 2015/0187616 A1 | 7/2015 | Huang et al. |
| 2016/0020117 A1 | 1/2016 | Hunter et al. |
| 2017/0162459 A1* | 6/2017 | Laven ............... H01L 21/67248 |

\* cited by examiner

SYSTEM AND METHOD FOR ANNEALING DIE AND WAFER

CROSS REFERENCE TO RELATED APPLICATIONS

This Application is a Divisional of application Ser. No. 15/906,166, filed on Feb. 27, 2018, now U.S. Pat. No. 11,011,394, which claims priority of U.S. Provisional Application No. 62/589,002, filed on Nov. 21, 2017, the entirety of which are incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. In some embodiments, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

During semiconductor device fabrication, various processes are typically performed. A thin layer of semiconductor material may be doped to alter the electrical characteristics of the material. Generally, doping is the process of implanting ions into the semiconductor material and is performed by an ion implant process wherein the semiconductor layer is bombarded with N-type and/or P-type ions or by an in situ process wherein ions are introduced as the semiconductor layer is being formed.

After the doping process, an annealing process is typically performed to activate the implanted ions (e.g., N-type and/or P-type ions). For example, the annealing process may be used to drive-in dopants to provide a suitable dopant profile. When performing the annealing process, it has been found that the individual dies of a wafer may not heat evenly: specifically, a different amount of heat may be absorbed at different regions of a semiconductor die and/or wafer. In some embodiments, the semiconductor die may exhibit a significant amount of temperature variation across the die. The variations in heat absorbed may stem from differences in doping level, pattern density, pattern configuration, pattern aspect ratio, reflectivity of layers, and/or other variations across a die. This is referred to herein as a pattern loading effect (PLE).

One challenge with the increasing complexity of semiconductor devices is the presence of a pattern loading effect during an annealing process. The pattern loading effect phenomenon derives from differences in radiant energy absorption in different areas of a semiconductor device or die on account of the different patterning (e.g., pattern density, aspect ratio of features, composition/reflectivity of features, etc.). The pattern loading effect has its disadvantages in efficiency and effectiveness of the characterizations of the semiconductor device.

The pattern loading effect and resultant temperature differences may result in the various semiconductor devices, e.g., transistors, resistors, capacitors, and the like, on the same semiconductor die to exhibit different electrical characteristics. For example, when a first region, e.g., edges of a die, is heated to a lower temperature than a second region, e.g., the center of the die, the dopants in the second region may not be sufficiently activated resulting in increased resistance and greater circuit delays than the first region. Thus, the various semiconductor devices or portions of the semiconductor die may have different electrical characteristics based upon the position on the die.

Figure 1:
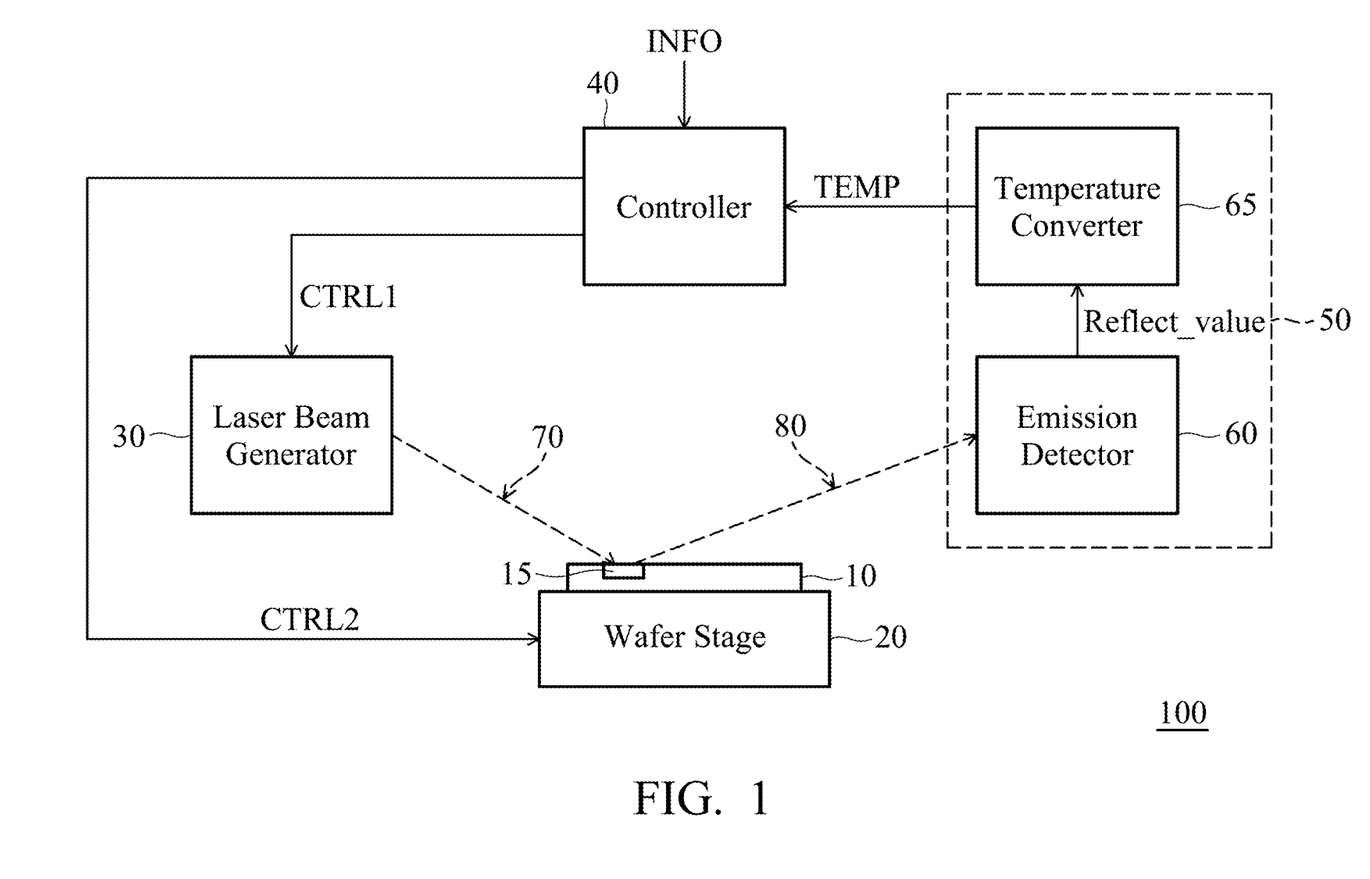
FIG. 1 shows a block diagram illustrating a system for annealing a wafer, in accordance with some embodiments of the disclosure.

FIG. 1 shows a block diagram illustrating a system 100 for annealing a wafer 10, in accordance with some embodiments of the disclosure. The system 100 includes a wafer stage 20 configured to hold a semiconductor substrate, such as the wafer 10. The wafer 10 includes multiple semiconductor dies 15 arranged in multiple rows and multiple columns, and the details of the wafer 10 and the semiconductor die 15 are described below.

The system 100 further includes a laser beam generator 30, a controller 40, and a measurement module 50.

The controller 40 is configured to receive manufacturing information INFO regarding the layout of the semiconductor die 15 to be annealed in the wafer 10, so as to provide a control signal CTRL1 to the laser beam generator 30 for performing an annealing process. In some embodiments, the controller 40 is configured to provide a control signal CTRL2 to the wafer stage 20, so as to control the action of the wafer stage 20 during the annealing process. Furthermore, the manufacturing information INFO further includes IMP information regarding ion implantation (IMP) energy, dose and area of the devices and/or features of the semiconductor die 15. According to the manufacturing information INFO, the controller 40 is capable of obtaining annealing parameters and annealing orbits. Moreover, the controller 40 is further capable of calculating the required activation energy for each IMP type, so as to obtain an annealing pattern. The details of the annealing process of the wafer 10 are described below.

The laser beam generator 30 is configured to project a laser beam 70 onto the semiconductor die 15 of the wafer 10 according to the control signal CTRL1 from the controller 40, so as to anneal the semiconductor die 15 of the wafer 10 along at least one orbit (or a path) of the anneal pattern on the semiconductor die 15. In some embodiments, the laser parameters (e.g., wavelength, energy, and spot size etc.) of the laser beam 70 are determined in response to the control signal CTRL1. Furthermore, the annealing orbits of the laser beam 70 are further determined according to the control signal CTRL1. Moreover, laser incident angle of the laser beam 70 is available according to the control signal CTRL1. In some embodiments, the laser beam generator 30 is a $CO_2$ laser generator.

In some embodiments, the laser beam generator 30 is a multi-laser generator capable of annealing the semiconductor die 15 in frontside or backside.

A portion of the laser beam 70 is reflected by the wafer 10, denoted as a reflected radiation 80. In some embodiments, the amount (e.g., intensity) of the reflected radiation 80 is dependent on a pattern of the semiconductor die 15.

In some embodiments, before the semiconductor die 15 of the wafer 10 is annealed, a self-alignment procedure is performed by the system 100 on the semiconductor die 15 and/or the wafer 10 via the laser beam generator 30 or an optical camera (not shown).

In some embodiments, the wafer stage 20 is controlled by the control signal CTRL2 from the controller 40, so as to move the wafer 10 according to the orbits of the annealing pattern.

The measurement module 50 is capable of measuring the temperature of the semiconductor die 15 in response to the laser beam 70. In some embodiments, the measurement module 50 may provide any means of measuring a reflectivity value Reflect_value of the laser beam 70, and the reflectivity value Reflect_value is determined according to the amount of reflected radiation 80. For example, the measurement module 50 includes an emission detector 60 and a temperature converter 65. The emission detector 60 is configured to receive the reflected radiation 80, and to provide information regarding the reflectivity value Reflect_value of the received reflected radiation 80 to the temperature converter 65. The temperature converter 65 is configured to convert the reflectivity value Reflect_value of the received reflected radiation 80 into the temperature TEMP, and to provide the temperature TEMP to the controller 40.

In some embodiments, the measurement module 50 is a thermal sensor integrated with the wafer stage 20. In some embodiments, the measurement module 50 is an infrared detector.

It should be noted that reflectivity variation of the reflected radiation 80 over the semiconductor die 15 is an indication of the temperature variations over the same region. For example, there may be an inverse relationship between reflectivity and temperature: regions exhibiting a higher reflectivity are lower in temperature in comparison to regions exhibiting lower reflectivity.

In some embodiments, in response to the temperature TEMP from the measurement module 50, the controller 40 is configured to provide the control signals CTRL1 and CTRL2, so as to project the laser beam 70 onto the semiconductor die 15 again. Furthermore, the laser parameters (e.g., wavelength, energy, or spot size etc.) of the laser beam 70 may be changed in response to the control signal CTRL2 corresponding to the temperature TEMP, so as to complete the annealing process of the semiconductor die 15. Specifically, by detecting the amount of reflected radiation 80, the system 100 is capable of adjusting anneal intensity.

In some embodiments, the system 100 is capable of cooling the semiconductor die 15 after or during the annealing process.

Figure 2:
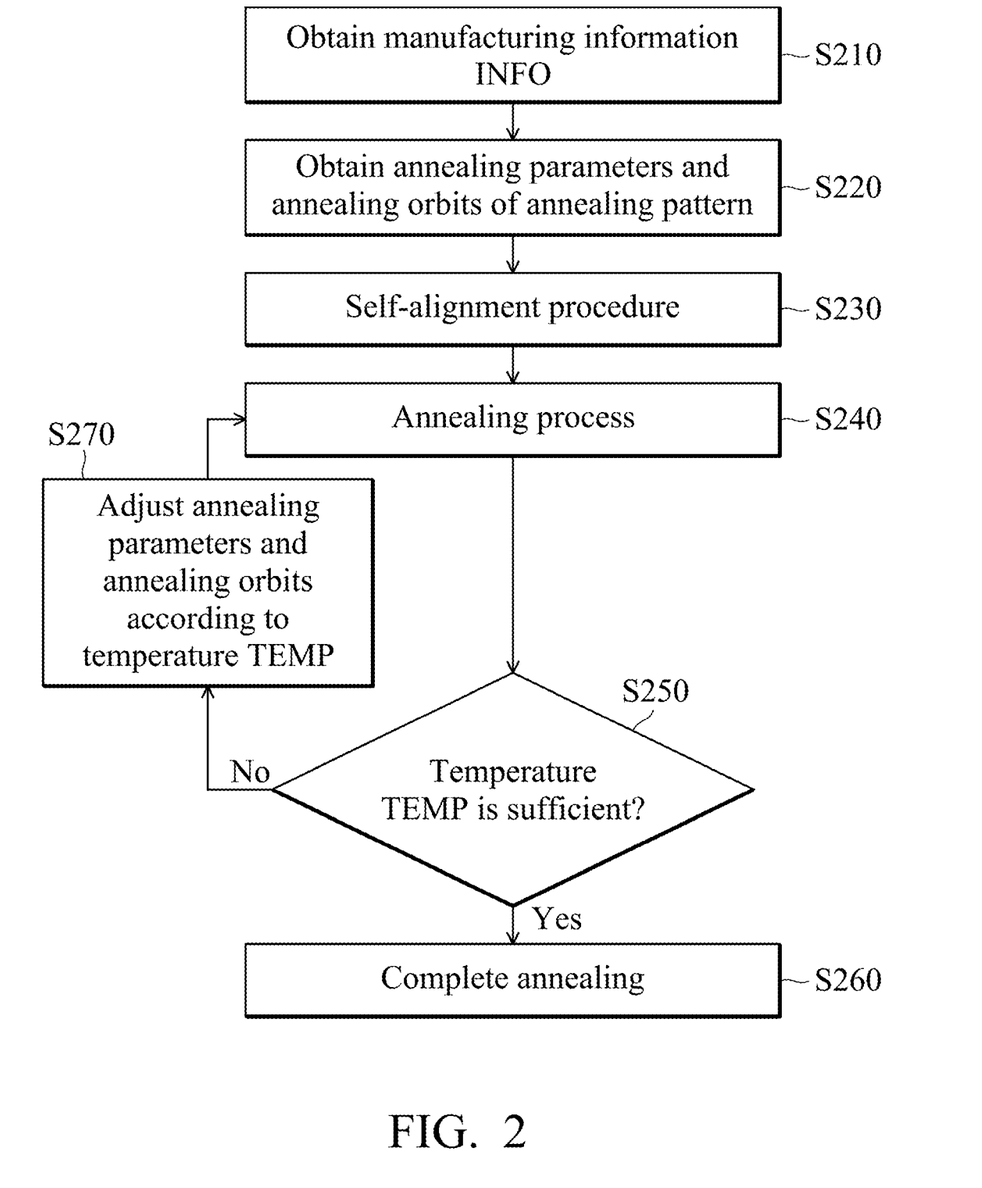
FIG. 2 shows a simplified flowchart illustrating a method for anneal the semiconductor die of the wafer of FIG. 1, in accordance with some embodiments of the disclosure.

FIG. 2 shows a simplified flowchart illustrating a method for anneal the semiconductor die 15 of the wafer 10 of FIG. 1, in accordance with some embodiments of the disclosure. Furthermore, the method of FIG. 2 is performed by the system 100 of FIG. 1 capable of partially annealing the semiconductor die 15 of the wafer 10 without a reticle (or a mask).

In operation S210, the manufacturing information INFO of the semiconductor die 15 to be annealed is obtained. As described above, the manufacturing information INFO includes the layout of the semiconductor die 15 to be annealed, the IMP energies/doses that are used to form various features of the semiconductor die 15 in an IMP treatment (e.g., a doping process), and so on. As described above, the manufacturing information INFO is input to the controller 40 of FIG. 1.

In operation S220, the controller 40 obtains annealing parameters and annealing orbits of the annealing pattern according to the manufacturing information INFO. For example, according to the manufacturing information INFO, the controller 40 is configured to arrange each annealing orbit to partially cover the semiconductor die 15 and to uncover other semiconductor dies 15 of in the wafer 10. Furthermore, the controller 40 further obtains alignment information of the semiconductor die 15 and/or the wafer 10 from the manufacturing information INFO.

In operation S230, the controller 40 is configured to perform a self-alignment procedure to align the wafer 10 and the semiconductor die 15. In some embodiments, the controller 40 controls an optical camera to align the semiconductor die 15 and/or the wafer 10 according to the alignment information from the manufacturing information INFO. In some embodiments, the controller 40 controls the laser beam generator 30 to align the semiconductor die 15 and/or the wafer 10 according to the alignment information from the manufacturing information INFO.

Figure 3:
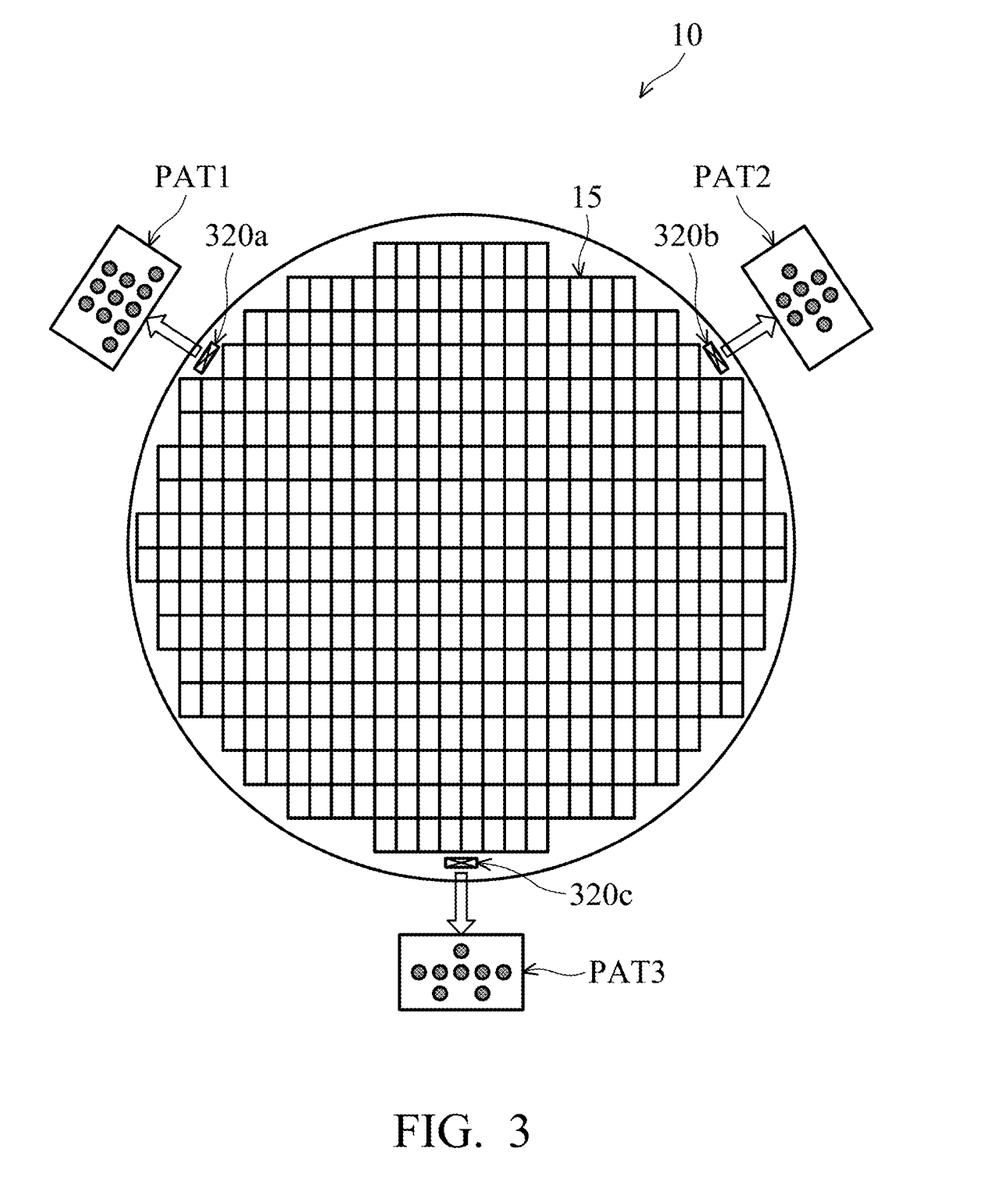
FIG. 3 shows a top view illustrating the wafer, in accordance with some embodiments of the disclosure.

FIG. 3 shows a top view illustrating the wafer 10, in accordance with some embodiments of the disclosure. The wafer 10 includes a semiconductor substrate. Furthermore, the wafer 10 may also include other elementary semiconductors such as germanium and diamond. Moreover, the wafer 10 may include a compound semiconductor and/or an alloy semiconductor.

The semiconductor dies 15 of the semiconductor substrate are arranged in multiple rows and multiple columns. The semiconductor dies 15 are separated from each other by multiple scribing lines (not shown). Furthermore, three alignment marks 320a, 320b and 320c are arranged in the wafer 10 for alignment, so as to perform the annealing process.

The semiconductor die 15 may include any number of semiconductor devices, such as field effect transistors (FETs), capacitors, resistors, conductive interconnects, and/or other suitable devices. The semiconductor die 15 may include various doped regions or regions of the substrate (including layers on the wafer 10) with suitable N-type or P-type dopants (impurities). Exemplary regions include active regions on which semiconductor devices can be formed; the active regions may be doped to form well regions. The doped regions including but not limited to active regions, may vary in dimension, dopant level, configuration, and/or other properties. The boundaries of the active regions may be defined by isolation structures such as shallow trench isolation (STI) features.

The semiconductor die 15 may also include any plurality of layers formed on a base substrate including conductive layers, insulating layers, masking layers, antireflective coatings, etch stop layers, gate layers, interconnection layers, and/or other features. These layers may form features (e.g., gate structures, conductive capacitor plates, interconnect lines, source/drain regions, isolation regions) of varying dimensions (e.g., height and widths).

In some embodiments, the semiconductor dies 15 may be representative of a single semiconductor device product. In some embodiments, the semiconductor dies 15 may be used to form any number of different semiconductor device products. In other words, the semiconductor dies 15 of the wafer 10 may be associated with different designs or a common design. For example, a first plurality of semiconductor dies 15 of the wafer 10 may be a first semiconductor device product or have a first design, and a second plurality of semiconductor dies 15 on the wafer 10 may be a second semiconductor device product or have a second design.

In FIG. 3, the alignment marks 320a, 320b and 320c have different patterns and different positions for identifying the relative position of the wafer 10. For example, the alignment mark 320a has a first pattern PAT1, and the alignment mark 320a is positioned in the ten o'clock position. The alignment mark 320b has a second pattern PAT2, and the alignment mark 320b is positioned in the two o'clock position. Moreover, the alignment mark 320c has a third pattern PAT3, and the alignment mark 320c is positioned in the six o'clock position. The patterns, positions and number of alignment marks 320a, 320b and 320c are used as an example, and not to limit the disclosure.

When the self-alignment procedure in operation S230 of FIG. 2 is performed, the controller 40 obtains the alignment information regarding the patterns and positions of the alignment mark 320a, 320b and 320c of the wafer 10. When the controller 40 determines that the alignment marks 320A, 320b and 320c are not in the right places, the controller 40 controls the wafer stage 20 to move, so as to place the wafer 10 in the correct position. For example, if the alignment marks 320a, 320b and 320c are respectively positioned in the eleven, three, and seven o'clock positions, the controller 40 controls the wafer stage to rotate the wafer 10, so as to place the wafer 10 in the correct position, i.e., the alignment marks 320a, 320b and 320c are respectively positioned in the ten, two, and six o'clock positions.

Figure 4:
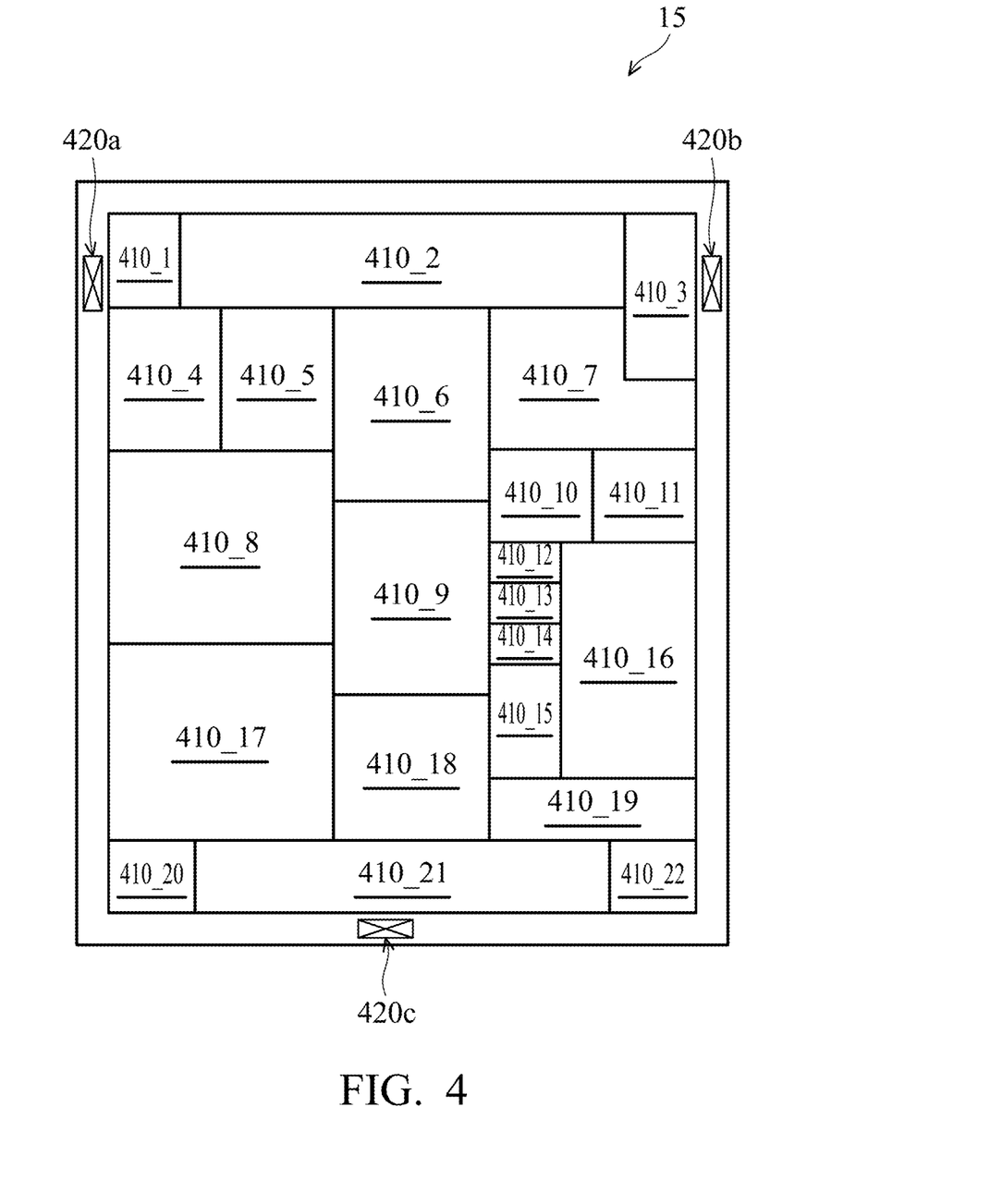
FIG. 4 shows a top view illustrating the semiconductor die of the wafer, in accordance with some embodiments of the disclosure.

FIG. 4 shows a top view illustrating the semiconductor die 15 of the wafer 10, in accordance with some embodiments of the disclosure. The semiconductor die 15 includes multiple macro blocks 410_1 through 410_22. Each of the macro blocks 410_1 through 410_22 is a circuit (e.g. digital, analog, mix-mode, memory) capable of performing a specific function of the semiconductor die 15. Similarly, three alignment marks 420a, 420b and 420c are arranged in the semiconductor die 15 for accurate alignment, so as to perform the annealing process accurately. In some embodiments, after the wafer 10 is cut, the three alignment marks 420a, 420b and 420c still remain on the semiconductor die 15. In some embodiments, the alignment marks 420a, 420b and 420c are arranged around the semiconductor die 15. In some embodiments, the alignment marks 420a, 420b and 420c are arranged in the boundaries of the circuits, areas, blocks of the semiconductor die 15.

As described above, the manufacturing information INFO includes the layout of the semiconductor die 15 and alignment information regarding the alignment marks 420a, 420b and 420c. For example, the manufacturing information INFO includes information regarding the layout of each component (e.g., transistor, resistor, diode, etc.) and feature (well, fin, dopant region, source/drain, etc.) within the macro blocks 410_1 through 410_22. Therefore, according to the alignment information regarding the patterns and positions of the alignment marks 420a, 420b and 420c of the semiconductor die 15, the self-alignment procedure is performed on the semiconductor die 15.

In FIG. 4, the alignment marks 420a, 420b and 420c have different patterns and different positions for identifying the relative position of the semiconductor die 15. In some embodiments, the patterns of the alignment marks 420a, 420b and 420c of FIG. 4 are the same as the alignment marks 320a, 320b and 320c of FIG. 3. Furthermore, the alignment mark 420a is positioned on the left edge of the semiconductor die 15. The alignment mark 420b is positioned on the right edge of the semiconductor die 15. Moreover, the alignment mark 420c is positioned at the bottom edge of the semiconductor die 15. In some embodiments, the patterns of the alignment marks 420a, 420b and 420c of FIG. 4 are different from the alignment marks 320a, 320b and 320c of FIG. 3. The patterns, the positions and the number of the alignment marks 420a, 420b and 420c are used as an example, and not to limit the disclosure.

Referring back to the flowchart of FIG. 2, in operation S240, after the semiconductor die 15 to be annealed is positioned according to the alignment marks 420A, 420b and 420c in operation S230, the controller 40 controls the laser beam generator 30 to perform an annealing process, so as to partially anneal the positioned semiconductor die 15 according to an annealing pattern and the annealing orbits within the annealing pattern. As described above, the controller 40 obtains the annealing pattern according to the manufacturing information INFO. Furthermore, when the semiconductor die 15 is annealed in operation S240, no physical reticle is used.

In some embodiments, the annealing pattern is formed by multiple orbits (or paths) with individual annealing energy (e.g., laser parameters). As described above, the manufacturing information INFO further includes IMP information regarding IMP energy, dose and area. Thus, according to the manufacturing information INFO, the optimized orbits and laser parameters corresponding to the annealing pattern are obtained by the controller 40. In some embodiments, the annealing pattern is obtained by a central server of semiconductor processes.

According to the annealing orbits and the laser parameters of the annealing pattern, the controller 40 provides the control signal CTRL1 to the laser beam generator and/or the control signal CTRL2 to the wafer stage 20, so as to anneal the positioned semiconductor die 15.

In some embodiments, the controller 40 provides the control signal CTRL1 to the laser beam generator 30, so as to project the laser beam 70 with the laser parameters onto the positioned semiconductor die 15 along the annealing orbits.

In some embodiments, the controller 40 provides the control signal CTRL1 to the laser beam generator 30, so as to provide the laser beam 70 with the laser parameters. Simultaneously, the controller 40 provides the control signal CTRL2 to the wafer stage 20, so as to move the positioned semiconductor die 15 according to the annealing orbit. Thus, the laser beam 70 from the laser beam generator 30 can be projected onto the positioned semiconductor die 15 along the annealing orbit.

Figure 5:
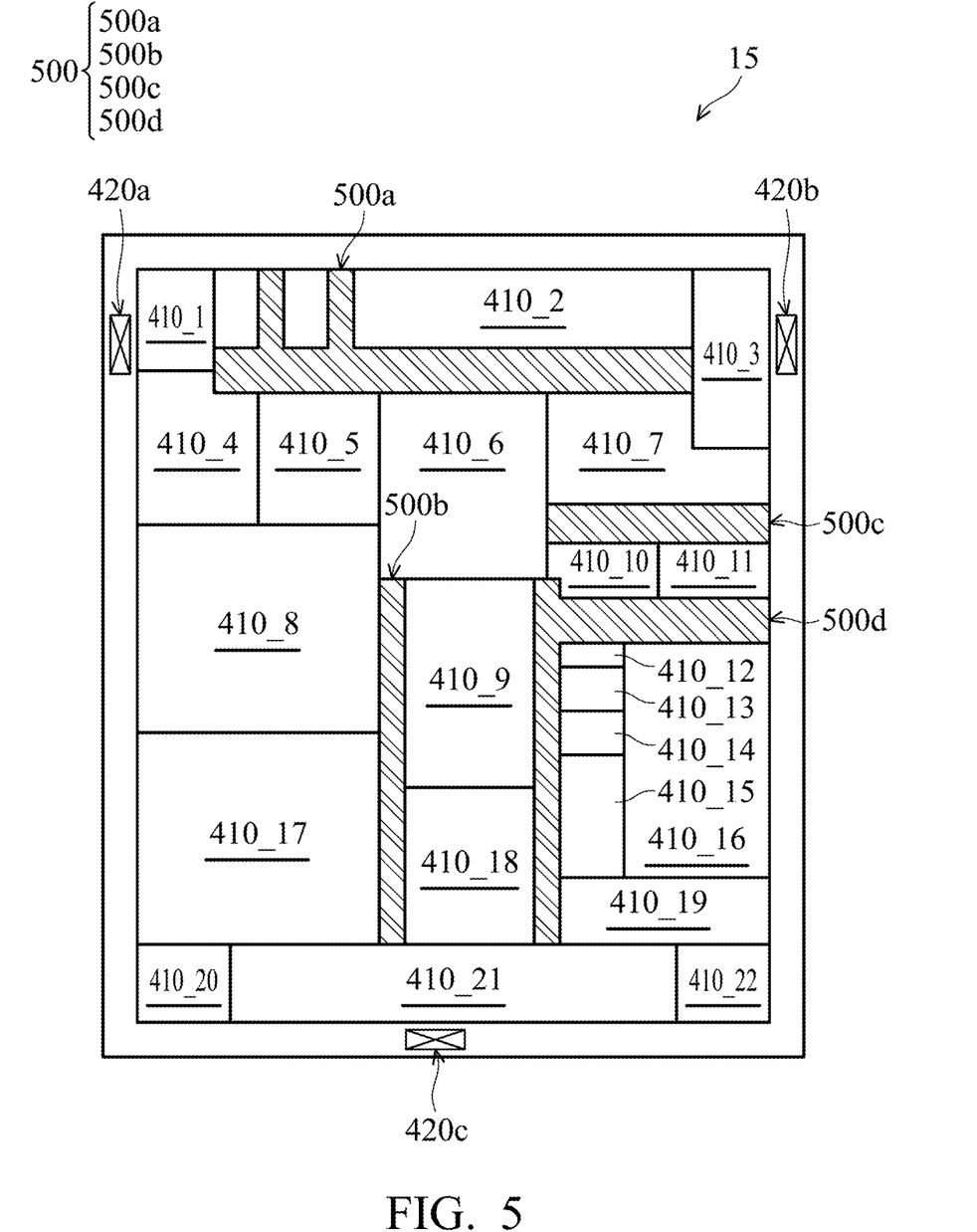
FIG. 5 shows a top view illustrating an annealing pattern of the semiconductor die of FIG. 4, in accordance with some embodiments of the disclosure.

FIG. 5 shows a top view illustrating an annealing pattern 500 of the semiconductor die 15 of FIG. 4, in accordance with some embodiments of the disclosure. The annealing pattern 500 is formed by multiple sub-patterns 500a through 500d. Furthermore, the sub-patterns 500a through 500d each includes multiple annealing orbits. The positions and the number of the sub-patterns 500a through 500d are used as an example, and not to limit the disclosure.

The sub-patterns 500a through 500d cover (or overlap) a portion of the macro blocks 410_1 through 410_22. In other words, some of the macro blocks 410_1 through 410_22 are not covered (or overlapped) by the annealing pattern 500. For example, the sub-pattern 500a covers the macro blocks 410_2, 410_4, 410_5, 410_6, and 410_7, the sub-pattern 500b covers the macro blocks 410_9 and 410_18, the sub-pattern 500c covers the macro blocks 410_7, 410_10 and 410_11, and the sub-pattern 500d covers the macro blocks 410_10, 410_11, 410_12, 410_13, 410_14, 410_15 and 410_19. Furthermore, the macro blocks 410_1, 410_3, 410_8, 410_17, 410_20, 410_21 and 410_22 are not covered by the sub-patterns 500a through 500d. Therefore, by using the annealing pattern 500, only required areas of the semiconductor die 15 can be annealed.

In some embodiments, the features of the macro blocks covered by the annealing pattern 500 are annealed in operation S240 of FIG. 2, and the features of the macro blocks that are not covered by the annealing pattern 500 are not annealed.

In some embodiments, the whole macro blocks 410_1 through 410_22 are annealed with a laser beam (e.g., 70 of FIG. 1) with a first laser parameter or an annealing lamp. Next, the features of the macro blocks covered by the annealing pattern 500 are re-annealed with a second laser parameter according to the operation S240 of FIG. 2. In some embodiments, different laser/lamp incident angle are available for different function demanded.

In some embodiments, the annealing orbits capable of annealing the semiconductor die 15 do not exceed the range of the semiconductor die 15 in FIG. 5. In other words, the annealing orbits do not cross another semiconductor die 15 of the wafer 10, i.e., other semiconductor dies 15 of the wafer 10 are uncovered by the annealing orbits of sub-patterns 500a through 500d of FIG. 5.

Figure 6A:
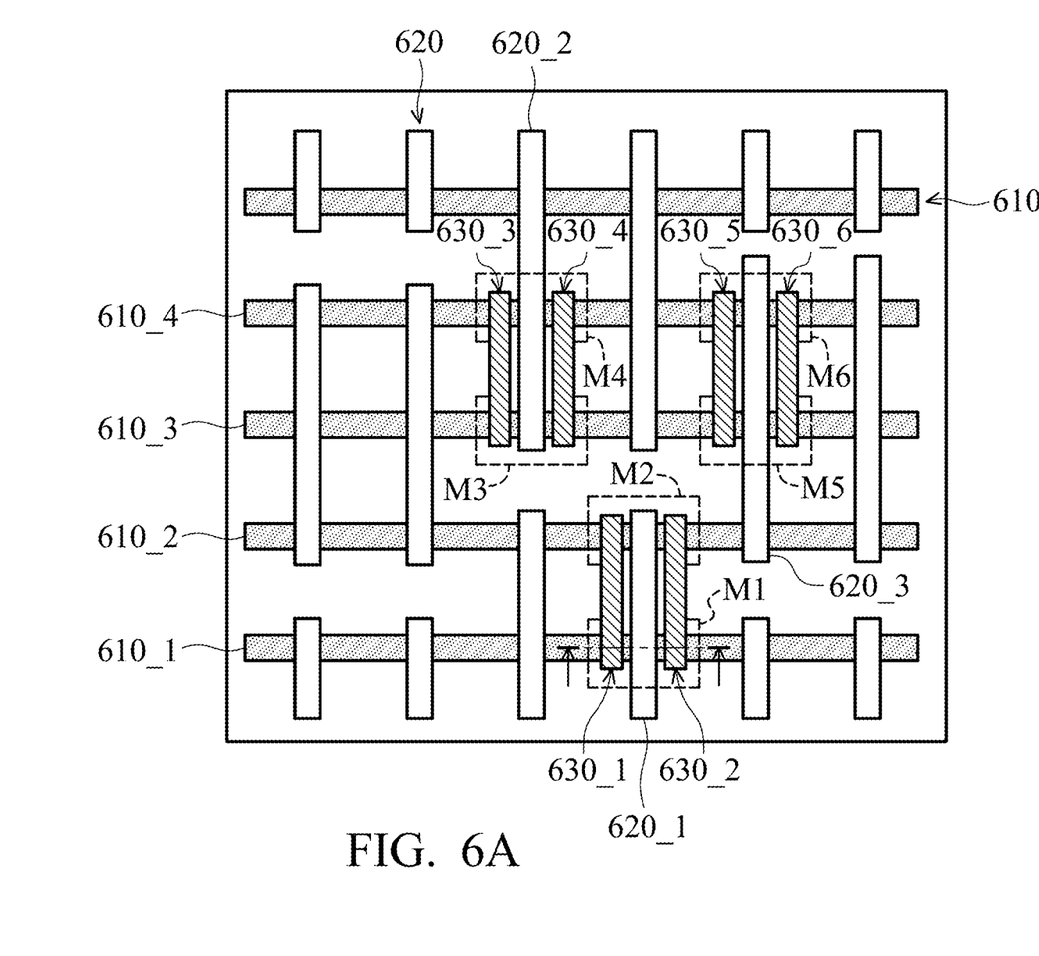
FIG. 6A shows a top view illustrating a zoom-in diagram of the semiconductor devices of the semiconductor die covered by the annealing pattern of FIG. 5.

FIG. 6A shows a top view illustrating a zoom-in diagram of the semiconductor devices of the semiconductor die 15 covered by the annealing pattern 500 of FIG. 5. In FIG. 6A, multiple transistors are formed by multiple semiconductor fins 610 arranged in rows and multiple gate electrodes 620 arranged in columns.

In FIG. 6A, the drain regions and the source regions of some transistors are annealed along the annealing orbits 630_1 through 630_6 in operation S240 of FIG. 2. For example, for the transistor M1 corresponding to the semiconductor fin 610_1 and the transistor M2 corresponding to the semiconductor fin 610_2 that share the same gate electrode 620_1, their drain regions are annealed by the laser beam 70 with a first laser parameter along the annealing orbit 630_1, and their source regions are annealed by the laser beam 70 with the first laser parameter along the annealing orbit 630_2. For the transistor M3 corresponding to the semiconductor fin 610_3 and the transistor M4 corresponding to the semiconductor fin 610_4 that share the same gate electrode 620_2, their drain regions are annealed by the laser beam 70 with a second laser parameter along the annealing orbit 630_3, and their source regions are annealed by the laser beam 70 with the second laser parameter along the annealing orbit 630_4. For the transistor M5 corresponding to the semiconductor fin 610_3 and the transistor M6 corresponding to the semiconductor fin 610_4 that share the same gate electrode 620_3, their drain regions are annealed by the laser beam 70 with a third laser parameter along the annealing orbit 630_5, and their source regions are annealed by the laser beam 70 with the third laser parameter along the annealing orbit 630_6. Therefore, only required areas of the semiconductor die 15 can be annealed in operation S240 of FIG. 2.

In some embodiments, the first, second and third laser parameters are the same. For example, the laser beam 70 projected onto the transistors M1 through M6 along the annealing orbits 630_1 through 630_6 has the same wavelength, energy or spot size.

In some embodiments, the first, second and third laser parameters are different. For example, the laser beam 70 projected onto the transistors M1 and M2 along the annealing orbit 630_1 and the laser beam 70 projected onto the transistors M3 and M4 along the annealing orbit 630_3 have different wavelength, energy or spot size. Specifically, the laser beam 70 projected onto the semiconductor die 15 has adjustable wavelength, energy or spot size corresponding to various orbits.

In some embodiments, the adjustable spot size of the laser beam 70 is capable of different function demanded (e.g., 10 nm-50 nm). Furthermore, extra small spot size of laser (under 10 nm) is capable for the laser beam 70.

In some embodiments, the adjustable wavelength is determined according to IMP type (e.g., 8-12 um) from the manufacturing information INFO. Specifically, IMP dosage/energy accompany with annealing laser length/intensity/melt of depth. In some embodiments, short wavelength (e.g., <800 nm) and long wavelength (e.g., >10000 nm) are combinable for different function demanded.

In FIG. 6A, the drain regions and the source regions of the transistors that are not covered by the annealing orbits are not being annealed. In some embodiments, the drain regions and the source regions of the transistors M1 through M6 are crystallized (e.g., crystal lattice formation), and the drain regions and the source regions of the transistors that are not covered by the annealing orbits are amorphous (e.g., amorphous lattice formation).

Figure 6B:
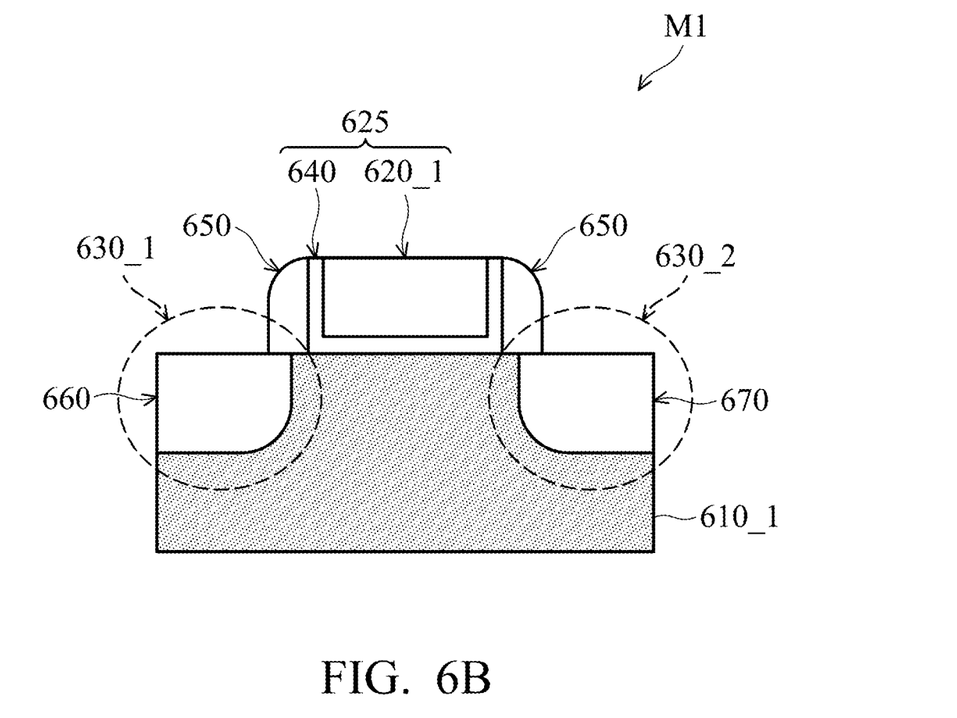
FIG. 6B shows a section view of the transistor M1 of FIG. 6A.

FIG. 6B shows a section view of the transistor M1 of FIG. 6A. The gate electrode 620_1 and a gate dielectric 640 from a gate structure 625, and the gate electrode 620_1 is formed over the gate dielectric 640 and is positioned over a top surface of the semiconductor fin 610_1. Therefore, a portion of the semiconductor fin 610_1 overlaps the gate structure 625 may serve as a channel region of the transistor M1.

In some embodiments, the spacer 650 of the transistor M1 is positioned over sidewalls and a top surface of the semiconductor fin 610_1. In addition, the spacer 650 may be formed on opposite sides of the gate structure 625.

In some embodiments, portions of the semiconductor fin 610_1 that are not covered by the gate structure 625 and the spacers 650 serve as the drain region 660 and the source region 670 of the transistor M1. In some embodiments, the drain region 660 and the source region 670 of the transistor M1 are formed by implanting the portions of the semiconductor fin 610_1 that are not covered by the gate structure 625 and the spacers 650 with an impurity.

As described above, the drain region 660 is annealed based on the annealing orbit 630_1, and the source region 670 is annealed based on the annealing orbit 630_2. In general, temperature of laser annealing will exceed 1000° C. and the temperature is close to melting point of silicon. Therefore, the areas or features beneath the annealing orbits have lattice distortion, crystallized or become to amorphous. Thus, the areas or features outside the annealing orbits (e.g., without annealing) have normal lattice formation, and the areas or features covered by the annealing orbits (e.g., with annealing) have difference lattice formation (or interface). Specifically, lattice constants (also called lattice parameters) of the areas or features beneath the annealing orbits and lattice constants of the areas or features outside the annealing orbits are different. In some embodiments, crystalline differences can be detected by transmission electron microscope (TEM) inspection or other monitoring. Because the areas or features outside the annealing orbits will not be annealed, no extra stress and no unexpected junction profile will affect the device performance of the semiconductor die 15.

Referring back to the flowchart of FIG. 2, in operation S250, when the semiconductor die 15 is annealed, the measurement module 50 is configured to measure temperature TEMP of the semiconductor die 15 according to the reflectivity value Reflect_value of the reflected radiation 80 in FIG. 1.

If it is determined that the temperature TEMP is sufficient to anneal the areas or features covered (or overlapped) by the annealing pattern 500 or the annealing orbits, the flowchart of FIG. 2 is completed in operation S260. In some embodiments, the semiconductor dies 15 are cut and packaged, so as to form integrated circuits (ICs).

Conversely, if it is determined that the temperature TEMP is insufficient for annealing the areas or features covered (or overlapped) by the annealing pattern 500 or the annealing orbits, the controller 40 is configured to adjust the annealing pattern, the laser parameters or the annealing orbits according to the temperature TEMP. Next, the annealing process of operation S240 is performed according to the adjusted annealing pattern, the adjusted laser parameters or the adjusted orbits, and then the temperature TEMP is detected in operation S250. The operations S270, S240 and S250 are repeated until the temperature TEMP is sufficient for annealing the areas or features covered (or overlapped) by the annealing pattern 500 or the annealing orbits.

In operation S250, instantly cold and hot areas of semiconductor die 15 are detected. According the temperature TEMP corresponding to the cold areas and the hot areas, the system 100 is capable of annealing the semiconductor die 15, thereby very uniform reflectance for loading effect free. For example, in response to the cold areas, the controller 40 controls the laser beam generator 30 to project the laser beam 70 with the higher energy on the cold areas of the semiconductor die 15. Conversely, in response to the hot areas, the controller 40 controls the laser beam generator 30 to project the laser beam 70 with the lower energy on the hot areas of the semiconductor die 15.

Embodiments of a semiconductor die, system, and method for annealing a wafer are provided. By using the annealing pattern obtained from the manufacturing information INFO, no physical reticle is used to perform the annealing process. As described above, the annealing pattern is formed by multiple annealing orbits associated with the corresponding laser parameters. The laser beam generator 30 is configured to project the laser beam 70 with the laser parameters along the annealing orbits on the semiconductor die 15, so as to partially anneal the semiconductor die 15 rather than completely anneal the semiconductor die 15. Furthermore, before the semiconductor die 15 is annealed, a self-alignment procedure is performed on the semiconductor die 15 according to the alignment marks on the semiconductor die 15. Moreover, when the semiconductor die 15 is annealed, no anti-type IMP is performed in the N/P MOS/FinFet process (for any IMP/Anneal loop). Furthermore, IMP compensation during the anneal process is capable. Based on the annealing pattern and IMP condition, the laser anneal intensity is adjusted to alleviate pattern loading effect. Therefore, anneal efficiency and anneal accuracy are improved.

In some embodiments, a system for annealing a wafer is provided. The system includes a wafer stage, a laser beam generator, and a controller. The laser beam generator is configured to generate a laser beam. The controller is configured to control the laser beam generator according to information regarding layout of a first semiconductor die of the wafer, so as to project the laser beam with a first laser parameter onto the first semiconductor die of the wafer on the wafer stage along at least one annealing orbit. The controller is configured to arrange the annealing orbit to partially cover the first semiconductor die of the wafer and to uncover a plurality of second semiconductor dies of the wafer.

In some embodiments, a system for annealing a wafer is provided. The system includes a wafer stage, a laser beam generator and a controller. The laser beam generator is configured to generate a laser beam. The controller is configured to control the laser beam generator according to information regarding layout of a semiconductor die of the wafer, to project the laser beam with a first laser parameter onto the semiconductor die of the wafer on the wafer stage along at least one annealing orbit of an annealing pattern, so as to anneal a first portion of the semiconductor die covered by the annealing orbit. The semiconductor die includes a plurality of macro blocks, and the semiconductor die is partially covered by the annealing orbit. The annealing pattern covers a portion of the macro blocks and boundaries between the portion of the macro blocks.

In some embodiments, a system for annealing a wafer is provided. The system includes a wafer stage, a laser beam generator, and a controller. The laser beam generator is configured to generate a laser beam. The controller is configured to control the laser beam generator according to information regarding layout of a first semiconductor die of the wafer, to project the laser beam with a first laser parameter onto the first semiconductor die of the wafer on the wafer stage along at least one annealing orbit of an annealing pattern, so as to anneal a first portion of the first semiconductor die covered by the annealing orbit. The first semiconductor die includes a plurality of macro blocks. The first semiconductor die is partially covered by the annealing orbit, and a plurality of second semiconductor dies of the wafer are uncovered by the annealing orbit. The annealing pattern covers a portion of the macro blocks and boundaries between the portion of the macro blocks.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system for annealing a wafer, comprising:
   a wafer stage;
   a laser beam generator configured to generate a laser beam; and
   a controller configured to control the laser beam generator according to information regarding layout of a first semiconductor die of the wafer, so as to project the laser beam with a first laser parameter onto the first semiconductor die of the wafer on the wafer stage along at least one annealing orbit,
   wherein the controller is configured to arrange the annealing orbit to partially cover both a first source/drain region of a first transistor of the first semiconductor die of the wafer and a second source/drain region of a second transistor of the first semiconductor die of the wafer and to uncover both a first gate electrode of the first transistor of the first semiconductor die of the wafer and a second gate electrode of the second transistor of the first semiconductor die of the wafer.

2. The system as claimed in claim 1, wherein the laser beam generator is configured to provide the laser beam with the first laser parameter to anneal a first portion of the first semiconductor die covered by the annealing orbit, and the laser beam generator is configured to provide the laser beam with a second laser parameter to anneal a second portion of the first semiconductor die, wherein the second laser parameter is different than the first laser parameter.

3. The system as claimed in claim 2, wherein the first and second laser parameters are wavelength, energy, or spot size of the laser beam.

4. The system as claimed in claim 1, wherein the laser beam generator is configured to provide the laser beam to anneal a first portion of the first semiconductor die covered by the annealing orbit, and a second portion of the first semiconductor die is not annealed by the laser beam.

5. The system as claimed in claim 1, further comprising:
   a measurement module configured to measure temperature of the first semiconductor die,
   wherein the controller is configured to control the laser beam generator to project the laser beam with a second laser parameter onto the first semiconductor die along the annealing orbit or another annealing orbit according to the measured temperature.

6. The system as claimed in claim 1, wherein before the laser beam with the first laser parameter is projected, the controller is configured to perform an alignment operation on the first semiconductor die according to a plurality of alignment marks on the first semiconductor die via an optical camera or the laser beam generator.

7. The system as claimed in claim 1, wherein the controller obtains the annealing orbit according to information regarding implantation energy and dose of implantation treatment of the first semiconductor die.

8. The system as claimed in claim 1, wherein the annealing orbit extends in a direction perpendicular to a lengthwise direction of the first source/drain region of the first transistor of the first semiconductor die of the wafer.

9. The system as claimed in claim 1, wherein the annealing orbit extends in a direction parallel to a lengthwise direction of the first gate electrode of the first transistor of the first semiconductor die of the wafer.

10. The system as claimed in claim 1, wherein a first length of the first gate electrode of the first transistor of the first semiconductor die of the wafer is greater than a second length of the annealing orbit.

11. A system for annealing a wafer, comprising:
    a wafer stage;
    a laser beam generator configured to generate a laser beam;
    a controller configured to control the laser beam generator according to information regarding layout of a semiconductor die of the wafer, to project the laser beam with a first laser parameter onto the semiconductor die of the wafer on the wafer stage along at least one annealing orbit of an annealing pattern, so as to anneal a first portion of the semiconductor die covered by the annealing orbit,
    wherein the semiconductor die comprises a plurality of macro blocks, and the semiconductor die is partially covered by the annealing orbit,
    wherein the annealing pattern covers a portion of the macro blocks and boundaries between the portion of the macro blocks,
    wherein a first length of a gate electrode of a transistor of the first semiconductor die of the wafer is greater than a second length of the annealing orbit.

12. The system as claimed in claim 11, wherein the first laser parameter is different from the second laser parameter.

13. The system as claimed in claim 12, wherein the first and second laser parameters are wavelength, power, or energy of the laser beam.

14. The system as claimed in claim 11, wherein a second portion of the semiconductor die outside the annealing orbit is not annealed by the laser beam.

15. A system for annealing a wafer, comprising:
    a wafer stage;
    a laser beam generator configured to generate a laser beam; and
    a controller configured to control the laser beam generator according to information regarding layout of a first semiconductor die of the wafer, to project the laser beam with a first laser parameter onto the first semiconductor die of the wafer on the wafer stage along at least one annealing orbit of an annealing pattern, so as to anneal a first portion of the first semiconductor die covered by the annealing orbit, wherein the first semiconductor die comprises a plurality of macro blocks, wherein the first semiconductor die is partially covered by the annealing orbit, wherein the annealing pattern covers a portion of the macro blocks and boundaries between the portion of the macro blocks, wherein the annealing orbit extends in a direction parallel to a lengthwise direction of a gate electrode of a transistor of the first semiconductor die of the wafer.

16. The system as claimed in claim 15, wherein the controller is configured to control the laser beam generator to project the laser beam with a second laser parameter onto the first semiconductor die, so as to anneal a second portion of the first semiconductor die outside the annealing orbit, wherein the first laser parameter is different from the second laser parameter.

17. The system as claimed in claim 16, wherein the first and second laser parameters are wavelength, power, or energy of the laser beam.

18. The system as claimed in claim 15, wherein a second portion of the first semiconductor die outside the annealing orbit is not annealed by the laser beam.

19. The system as claimed in claim 15, further comprising:

a measurement module configured to measure temperature of the first semiconductor die in response to the laser beam with the first laser parameter, wherein the controller is configured to control the laser beam generator to project the laser beam with a second laser parameter onto the first semiconductor die along the annealing orbit or another annealing orbit according to the measured temperature.

20. The system as claimed in claim 15, wherein a first length of the gate electrode of the transistor of the first semiconductor die of the wafer is greater than a second length of the annealing orbit.

\* \* \* \* \*